Sept. 19, 1967 R. T. KUEHN ET AL 3,343,048

FOUR LAYER SEMICONDUCTOR SWITCHING DEVICES HAVING
A SHORTED EMITTER AND METHOD OF MAKING THE SAME

Filed Feb. 20, 1964

WITNESSES:

John G. Chopp

James F. Young

INVENTORS

Richard T. Kuehn, Adalbert N. Knopp
and John J. Steinmetz, Jr.

BY Gordon H. Telfer

ATTORNEY 3,343,048

FOUR LAYER SEMICONDUCTOR SWITCHING DEVICES HAVING A SHORTED EMITTER AND METHOD OF MAKING THE SAME

Richard T. Kuehn, Ligonier, Adalbert N. Knopp, Greensburg, and John J. Steinmetz, Jr., Monroeville, Pa., assignors to Westinghouse Electric Corporation, Pittsburgh, Pa., a corporation of Pennsylvania Filed Feb. 20, 1964, Ser. No. 346,269
3 Claims. (Cl. 317—234)

This invention relates generally to semiconductor switching devices having four successive semiconductive regions of alternate semiconductivity type with terminals at least on the two outer regions and, more particularly, to such devices, and methods of making them, wherein one of the outer regions is shorted to the adjacent inner region.

A semiconductor switching device, for example, one having successive n, p, n and p type regions, has a forward characteristic wherein switching occurs from a high impedance to a low impedance state upon the application of a magnitude of voltage across the four regions of the device which is termed the breakover voltage. For many applications, it is desirable that the breakover voltage be of large magnitude (for example, substantially greater than 500 volts). In devices of the type known as controlled rectifiers, wherein a control terminal is provided on one of the inner regions to effect switching even when the voltage applied across the outer regions is not of the breakover voltage magnitude, a relatively high breakover voltage is necessary so that the control terminal or gate can provide effective control of switching. In this discussion, the breakover voltage means that voltage causing turn-on with no signal applied to the control terminal.

It is also desirable in devices of this type that the breakover voltage be relatively independent of the temperature at which the device is operated. In the past, devices exhibited a sharp drop in breakover voltage with increasing temperature. It has even been the case that many devices fabricated by techniques of the prior art were necessarily rejected because at temperatures of about 125° C. and above they exhibited zero breakover voltage, that is, the device at those temperatures, due to thermal breakdown within the device, could not be maintained in the high impedance condition. The control of the fabrication process to insure a high, temperature independent, breakover voltage has been a severe problem and one which has kept production yields of this type of device low.

Another important characteristic of controlled rectifiers is the power handling capability. To maximize power handling capability, the magnitude of current the device will carry in the forward direction without thermal degradation must be maximized. In device design this entails consideration of heat dissipation, low resistance large area contacts, thermal stress avoidance and other factors. At this time, devices with higher power handling capability cannot be readily made merely by increasing the size of the device. This is the case because larger semiconductive wafers have nonuniformities in resistivity and carrier lifetime to such an extent that additional problems are encountered in achieving desired junction characteristics.

At this stage of the art, it is generally recognized that the highest power handling capability from a device of given physical size is most readily achieved by utilizing a combination of diffusion and alloying operations in fabrication. Three regions of the four region structure are formed by diffusing a layer of one type of semiconductivity on a starting wafer of opposite type and separating the diffused layer at or near the edge to obtain two distinct regions on opposite surfaces of the starting material. The fourth region (emitter) is formed by fusing to a surface of one of the diffused layers an alloy foil member having an impurity capable of imparting semiconductivity of the same type as the starting material. Upon cooling, the regrown emitter region has a member of eutectic alloy in good thermal and electrical contact with substantially its entire surface so that good power handling capability is achieved. Such a diffused and alloyed structure is described in Stein and Torok patent 2,980,832, issued April 18, 1961, which should be referred to for further information on this type of structure.

A further improvement for achieving high power handling capability is the compression bonded encapsulation technique. The same basic four region structure formed by diffusion and alloying is used. However, rather than employing soldering techniques to mount the device in its package, the device and its contacts are placed under continuous pressure to ensure good thermal and electrical contact. Copending applications Serial No. 225,351, filed September 21, 1962, and Serial No. 232,546, filed October 23, 1962, now Patents 3,155,885, November 3, 1964, and 3,252,060, May 17, 1966, respectively, should be referred to for a fuller description of compression bonded encapsulation suitable for encapsulating devices in accordance with this invention. Prior to compression bonded encapsulation, the surfaces to be pressure bonded must be sufficiently smooth so that good over all contact can be made. Etchants used to treat the surface of the semiconductive material may attack the pressure bonded surfaces and cause nonuniformities. If the contact surfaces are not protected from the etchant another problem arises because metal may be carried by the etchant to the exposed junctions of the device.

It has been recognized that a short across the emitter-base junction of the device substantially improves the thermal stability of controlled rectifiers. Power devices, having an alloyed emitter region as above described, have been made with a short produced by alloy fusion across a portion of the emitter-base junction. While this modification of standard power device fabrication has been employed with success, difficulty is encountered in locating the additional alloy foil member in the precise relationship necessary to the emitter alloy foil member so that an effective short is provided without irregular penetration of the diffused base layer. Additionally, it is the case that the regrown region formed by the fusion of an alloyed short is subject to attack by etchants used on the semiconductive material that may severely impair the effectiveness of the short on the surface. The regrown region may inadvertently extend to the internal junction of the device in which case an inoperative device may result.

It is, therefore, an object of the present invention to provide an improved four layer semiconductor switch that has a high degree of temperature stability in its breakover characteristic while preserving the power handling capability of the device.

Another object is to provide a semiconductor four layer switch having a shorted emitter that does not require the performance of difficult fabrication operations.

Another object is to provide a semiconductor four layer switch that provides inherent protection of surfaces to be compression bonded against attack by etchants used on the semiconductor material and also helps avoid contamination of p-n junctions.

The invention, in brief, achieves the foregoing and additional objects and advantages by providing a layer of an etch resistant metal such as gold, silver or platinum on the surface of the semiconductor device to produce an effective short at the outer perimeter of the emitter-base junction without requiring recrystallization of the semiconductive material. The shorting layer is deposited, for example, by plating or evaporation and is performed subsequent to the fusion operation in which the emitter is formed and prior to removal of the edge of the device for the separation of the diffused layer.

In the preferred manner of practicing the present invention, the etch resistant metal is deposited over the entire surface of the compression bonded anode contact assembly to protect it from etchant attack so that it can be securely compression bonded over its entire surface to the mounting or header for the device.

The present invention and the above-mentioned and additional objects and advantages thereof will become more apparent with reference to the following description taken with the accompanying drawing wherein.

Figure 1:
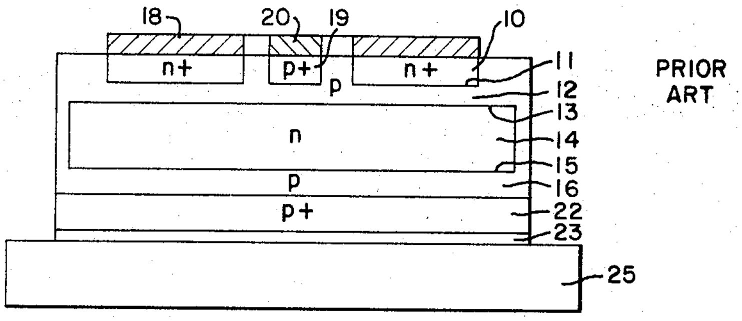
FIGURE 1 is a cross-sectional view of a semiconductor switching device structure in accordance with the prior art that may be modified in accordance with the present invention.

It will be recognized that in the drawing the dimensions of the semiconductor structures shown have been greatly exaggerated, particularly in the thickness dimension, for clarity of illustration. It will also be recognized that while devices having an n-p-n-p structure are described as illustrative of the practice of the present invention, devices having p-n-p-n structures may also be utilized.

FIGURE 1 shows the basic structure resulting from diffusion and alloy fusion on which the present invention improves. It comprises four successive semiconductive regions including emitter 10, base 12, base 14 and emitter 16 of alternate semiconductivity type with p-n junctions 11, 13, and 15 between adjacent regions. In the illustrated structure the region 10 has an annular configuration. The regions 12 and 16 and junctions 13 and 15 are, at this stage of tthe fabrication process, joined at the edge of the semiconductive slice. The regions 12 and 16 are formed, in this example, by the diffusion of a p-type impurity into an n-type semiconductive wafer. The region 10 is formed by the fusion of an alloy foil member containing donor type impurities to the surface of the adjacent region 12 and is therefore of recrystallized semiconductive n+ material with a contact 18 of eutectic alloy joined thereto. In the same fusion operation an ohmic contact to the region 12 is formed in the opening of the emitter region producing a recrystallized p+ region 19 with contact 20 of eutectic alloy thereon. An ohmic contact to region 16 is formed by the fusion of an alloy foil member containing an acceptor impurity resulting in a recrystallized p+ region 22 with metal contact 23 of eutectic alloy thereon. Joined to the contact 23 is a thermally and electrically conductive member 25 having closely matched thermal expansion characteristics to those of the semiconductive material.

In actual practice devices in accordance with this invention have been successfully fabricated wherein the original semiconductive material has been of single crystal, n-type silicon having a resistivity of about 20 ohm centimeters. The p-type diffusion for regions 12 and 16 has been performed utilizing a two step diffusion operation wherein aluminum is first diffused to provide a shallow impurity concentration gradient at the junctions 13 and 15 subsequent to which a gallium diffusion is performed to achieve a surface concentration of about $2\times10^{17}$ atoms per cubic centimeter. The thickness of the original n-type wafer was about 10 mils and the total depth of the diffused layer was about 70 microns. For the emitter region 10, an alloy foil member of gold having about 0.5 percent by weight antimony therein was used. The gate contact 20 was formed using an alloy foil of gold containing about 0.2 percent by weight boron. The contact 23 was formed using an aluminum foil. The alloy foil members and diffused wafer were stacked on the member 25, that was of molybdenum, and heated to a temperature of about 700° C. for a time of about 10 minutes.

The foil members form recrystallized regions 10, 19 and 22 with contacts of eutectic alloy 18, 20 and 23 thereon and the aluminum eutectic alloy 23 adheres to the molybdenum member 25. The member 25 may be of any metal that has a coefficient of thermal expansion similar to that of the semiconductive material. For silicon, such metals include molybdenum, tungsten and base alloys thereof.

As described in the introduction, the achievement of a shorted emitter in a structure like that shown in FIGURE 1 has been previously carried out by disposing an alloy foil member around the outer periphery of the member 18 which is fused at the same time and makes ohmic contact to p-type region 12 as well as flowing together with the material of contact 18 to form an electrical short. This process results in a recrystallized p+ region at the outer perimeter of the emitter junction whose depth may vary considerably because of inadequate means of controlling the placement of the alloy foil member precisely enough so as to achieve uniform shorting around the junction perimeter.

Figure 2:
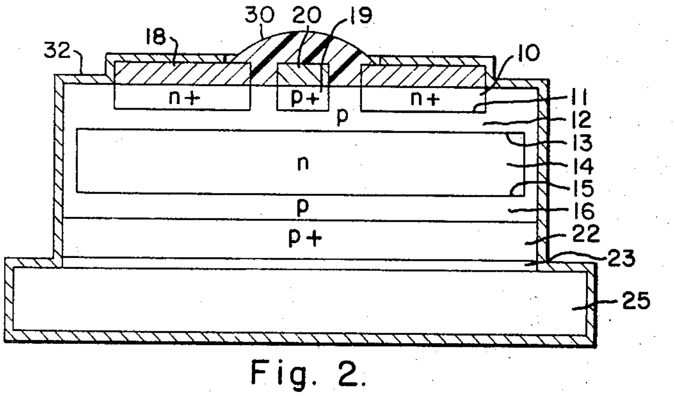
FIGURE 2 is a cross-sectional view of a semiconductor device structure like that of FIGURE 1 after additional processing in accordance with the present invention.

FIGURE 2 illustrates how the further processing to achieve a shorted emitter device is carried out in accordance with this invention. All of the elements illustrated in FIGURE 1 are shown in FIGURE 2. In addition, a quantity of masking material 30 is disposed over the gate contact 20 and the inner periphery of the emitter junction 11. This masking material may be composed of any inert substance that adheres to the structure and acts as a barrier of metal ions which would otherwise be deposited thereon in the subsequent processing. Suitable for use as the masking material are waxes such as paraffin or that sold under the tradename Apiezon wax, masking tape, or a masking material applied as a suspension in an organic solvent such as that sold under the tradename Delchem by Pennsalt Chemical Corporation.

It will be appreciated that in instances in which the present invention is applied to the provision of a shorted emitter on a two terminal semiconductor device, that is, where the gate contact 20 is omitted, that the emitter region 10 and contact 18 may then be continuous and, hence, the mask 30 would not be necessary.

The structure of FIGURE 2 also illustrates a metal layer 32 over all the exposed surfaces. This metal layer is deposited as a layer of metal particles, the metal being one which is not attacked by etchants used on the semiconductive material. Suitable metals are one or more members of the group consisting of gold, silver and members of the platinum group of elements. Successful results have been obtained in the practice of this invention by the use of gold which is more economical than some others of the noble metals. The gold, or other noble metal, may be deposited by a variety of known techniques such as plating or evaporation. Successful results have been obtained by immersion plating of gold utilizing a commercially available gold bath sold under the trade name Atomex by Engelhard Industries. A number of suitable plating baths for depositing a layer of noble metal on semiconductors such as silicon are known and available.

Prior to the gold plating or other deposition, the surfaces of the device must be suitably prepared so that the deposited metallic particles will be adherent thereto. Subsequent to the metal deposition various convention cleaning and sintering steps are performed. The following is an example of how these steps of the process may be performed.

For the immersion of gold plating, the device is placed in a cleanup etchant such as one containing about 50% by volume HCl for about 15 minutes at room temperature. Other known etchants such as one containing potassium cyanide may also be employed for this purpose. Next the device is placed in a nickel bath for about 5 minutes at about 93° C. as is conventional for the plating of gold onto silicon. Subsequently the structure is rinsed in deionized water at room temperature and then placed in the gold bath for about 3 minutes. Following the plating, the structure is again rinsed in deionized water and dried in air or vacuum at room temperature. After drying the device is heated to a temperature of about 300° C. for about 30 minutes in air for the purpose of sintering the deposited metal so as to form a coherent layer that adheres to the basic structure.

It will be noted that in the practice of this invention the deposited metal is not heated to the extent that alloying with the semiconducive material occurs so that there is no recrystallized region at the periphery of the emitter junction to create the problems that have been sometimes previously encountered in the use of alloyed shorts. It will also be understood that the particular operations above described for the deposition of the metal may be varied in accordance with plating technology.

Figure 3:
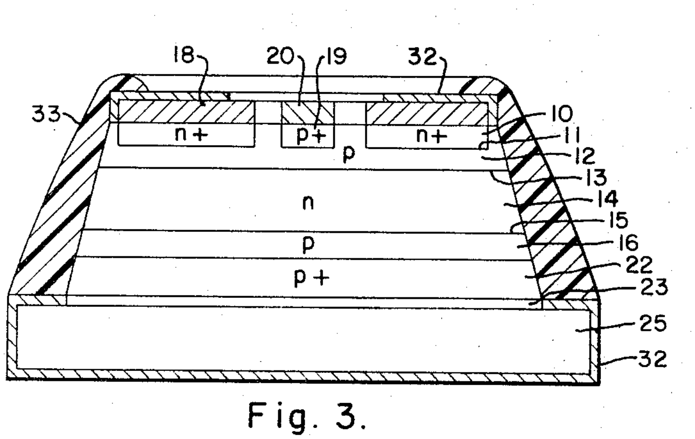
FIGURE 3 is a cross-sectional view of a semiconductor structure like that of FIGURE 2 after further processing in accordance with this invention.

Referring now to FIGURE 3 the structure is shown after the edge of the semiconductive device has been removed, for example by sandblasting, grinding or other treatment. The purpose of this operation is to separate the regions 12 and 16, and juctions 13 and 15, so that now a truly four region structure results. In this operation the gold plating 32 is also removed from the periphery of the device. However, it is retained on all of the portions of the device including the stress relieving member 25. Then a cleanup chemical etch is applied, such as one of two parts nitric acid, 1 part hydrofluoric acid and 1 part acetic acid, to clean the exposed semiconductive surface.

The gold plating 32 serves the important purpose of protecting the member from any attack by the cleanup etchant. It has been found in the past when employing fixtures of an inert material around the molybdenum base member 25, that some acid still attacks it. This results in some uneveness in the bottom surface of member 25 that minimizes the effectiveness of the thermal and electrical contact to a compression bonded mounting. Additionally, the protection provided by the metal layer 32 prevents the etchant from picking up metal particles from the member 25 and carrying them to the exposed p-n junctions 13 and 15.

The exposed surface of the device is then coated with a protective material 33 such as silicone resin. Other known passivating materials such as silicon dioxide may also be employed. Subsequent mounting, lead attachment and compression handled encapsulation is performed in accordance with known techniques.

Significant results have been obtained with the practice of the present invention in improving the temperature stability of devices. For example, devices without the plated short that exhibited breakover voltages of about 1,000 volts at room temperature and no breakover voltage at 125° C. have, subsequent to gold plating in accordance with this invention, exhibited breakover voltages at 125° C. of about 800 volts. The improvement in the temperature stability of the breakover voltage has been achieved without impairing other characteristics of the device. For example, the reverse voltage and current which the device sustains at room temperature or elevated temperatures has been found to be substantially the same. The firing current necessary to effect switching by the application of a signal to the gate contact has been found to be substantially unchanged as has been the forward voltage drop. These characteristics are significant in that previously it has been very difficult to obtain a device having the breakover characteristic with simultaneously sensitive gate characteristics (low firing current).

While the present invention has been shown and described in a few forms only, it will be apparent to those skilled in the art that changes and modifications may be made without departing from the spirit and scope thereof.

What is claimed is:

1. A semiconductor switching device comprising: first, second, third and fourth successive semiconductive regions of alternate semiconductivity type with a p-n junction between adjacent pair of said regions; said second and fourth regions being of diffused semiconductive material; said first region being of recrystallized semiconductive material with an alloyed contact thereon; an electrical short across at least a portion of said p-n junction between said first and second regions comprising a layer of etch resistant metal adherent to said second region and to said alloyed contact on said first region, said etch resistant metal being at least one member selected from the group consisting of gold, silver and members of the platinum group of elements; a member of metal selected from the group consisting of molybdenum, tungsten and base alloys thereof joined to said fourth region and a layer of said etch resistant metal also disposed on the surface of said member.

2. A method of producing a short between a first semiconductive region and a second semiconductive region of recrystallized semiconductive material that are, respectively, a base region and an emitter region of a semiconductor switch comprising four regions, said method including the steps of: depositing a layer of particles of an etch-resistant metal by immersion plating on the exposed junction between said two regions, said metal being at least one member of the group consisting of gold, silver and members of the platinum group of elements; and heating only to the extent of causing said particles to join into a coherent layer and said layer to adhere to said regions without further recrystallization of said semiconductive material.

3. In a method of fabricating a semiconductor controlled rectifier, the steps including: diffusing an impurity into the surfaces of a semiconductive wafer of a first type of semiconductivity to form a surface layer of a second type of semiconductivity; forming a stack including said diffused wafer on a first member that when fused forms an ohmic contact with said surface layer, said first member being on a second member of at least one member of the group consisting of molybdenum, tungsten and the base alloys thereof, a third member that when fused forms a rectifying contact with said surface layer being on the opposite surface of said diffused wafer from said first member, a fourth member that when fused forms an ohmic contact with said surface layer also being on said opposite surface; heating to fuse said first, third and fourth members to said diffused wafer and to cause said second member to adhere to said first member; masking said fused fourth member and a portion of said third member in proximity to said fourth member; depositing onto the fused and masked structure, particles of at least one metal of the group consisting of gold, silver and members of the platinum group of metals; heating to form an adherent layer of said metal without fusion with the semiconductive material; removing the edge of said diffused wafer to separate said surface layer and said metal layer while retaining said metal layer on the portion of said fused third member remote from said fourth member and the adjacent portion of said surface layer and also on said second member.

References Cited

UNITED STATES PATENTS

| | | | |
|---|---|---|---|
| 2,993,154 | 7/1961 | Goldey et al. | 317—235 |
| 3,090,873 | 5/1963 | Mackintosh | 307—88.5 |
| 3,124,703 | 3/1964 | Sylvan | 307—88.5 |
| 3,239,392 | 3/1966 | Sadler | 148—177 |
| 3,242,389 | 3/1966 | Wallmark | 317—234 |
| 3,263,139 | 7/1966 | Turner | 317—235 |
| 3,280,392 | 10/1966 | Benda | 317—235 |
| 3,287,239 | 11/1966 | Froschle et al. | 204—143 |

JOHN W. HUCKERT, *Primary Examiner.*

R. SANDLER, *Assistant Examiner.*